United States Patent
Wang et al.

(10) Patent No.: US 12,262,600 B2
(45) Date of Patent: Mar. 25, 2025

(54) DISPLAY PANEL, DISPLAY DEVICE, AND METHOD FOR MANUFACTURING A DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhi Wang, Beijing (CN); Yue Long, Beijing (CN); Weiyun Huang, Beijing (CN); Yao Huang, Beijing (CN); Benlian Wang, Beijing (CN); Lili Du, Beijing (CN); Yudiao Cheng, Beijing (CN); Bo Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 17/636,655

(22) PCT Filed: Mar. 31, 2021

(86) PCT No.: PCT/CN2021/084506
§ 371 (c)(1),
(2) Date: Feb. 18, 2022

(87) PCT Pub. No.: WO2022/205113
PCT Pub. Date: Oct. 6, 2022

(65) Prior Publication Data
US 2023/0354653 A1 Nov. 2, 2023

(51) Int. Cl.
*H10K 59/126* (2023.01)
*H10K 59/12* (2023.01)
(Continued)

(52) U.S. Cl.
CPC ....... *H10K 59/126* (2023.02); *H10K 59/1201* (2023.02); *H10K 59/123* (2023.02); *H10K 59/131* (2023.02)

(58) Field of Classification Search
CPC .... H10K 59/126; H10K 59/12; H10K 59/123; H10K 59/65
See application file for complete search history.

(56) References Cited

U.S. PATENT DOCUMENTS

| 10,962,850 B1 | 3/2021 | Yang et al. |
| 2018/0175077 A1* | 6/2018 | Koo ..................... H10K 59/126 |

(Continued)

FOREIGN PATENT DOCUMENTS

| CN | 108681131 A | 10/2018 |
| CN | 108682299 A | 10/2018 |

(Continued)

OTHER PUBLICATIONS

Extended European Search Report for EP Application No. 21933782.1 mailed Jul. 26, 2023, 8 pages.

*Primary Examiner* — Alia Sabur
(74) *Attorney, Agent, or Firm* — Myers Bigel, P.A.

(57) ABSTRACT

The present application discloses a display panel, a display device and a method for manufacturing a display panel. The display panel includes a first display area, including a plurality of first light emitting units and a first driving layer for driving the plurality of first light emitting units, and a second display area, at least partially surrounded by the first display area, and making ambient light at least partially transmitted. The first driving layer includes a first light shielding pattern, the first light shielding pattern at least partially surrounding the second display area and including a hollow structure which exposes at least part of the second display area.

17 Claims, 11 Drawing Sheets

Figure 1:
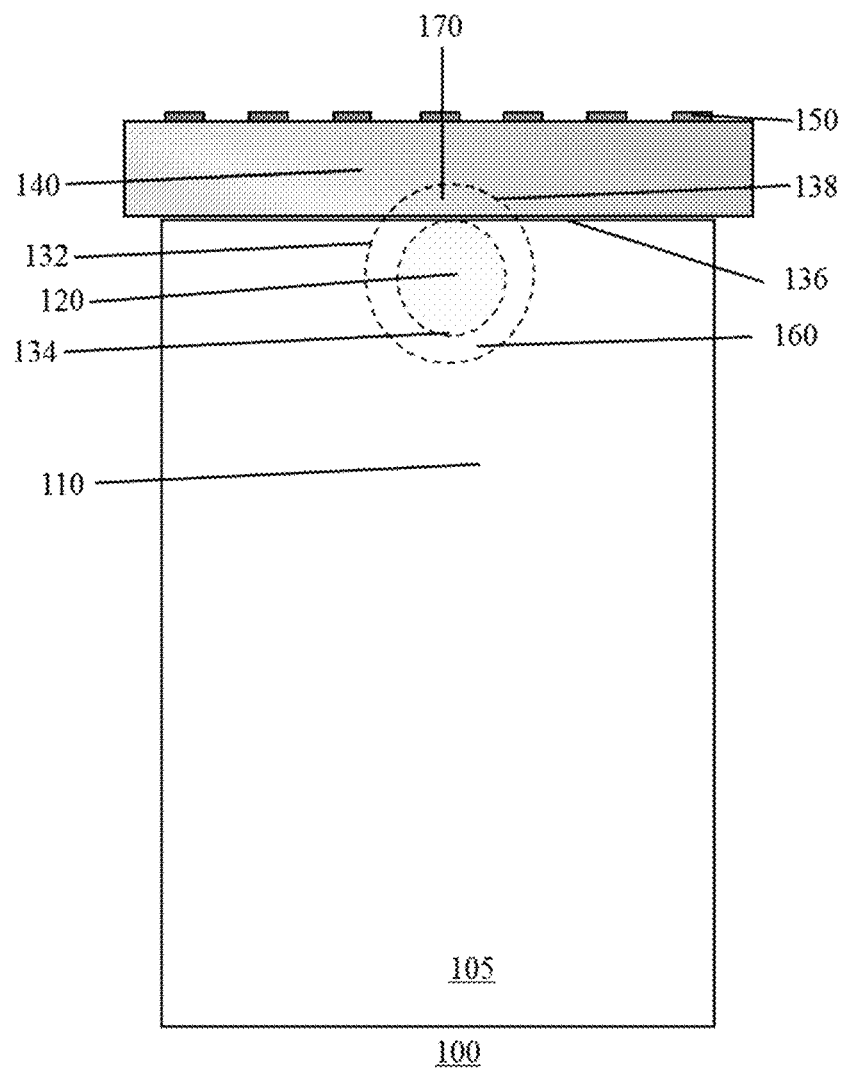

(51) Int. Cl.
 *H10K 59/123* (2023.01)
 *H10K 59/131* (2023.01)

(56) References Cited

U.S. PATENT DOCUMENTS

| | | |
|---|---|---|
| 2019/0260919 A1 | 8/2019 | Kwak et al. |
| 2021/0118909 A1 | 4/2021 | Hsieh |
| 2021/0202621 A1 | 7/2021 | Liang et al. |
| 2021/0210510 A1 | 7/2021 | Hsieh |
| 2021/0367013 A1* | 11/2021 | Yuan .................... H10K 59/126 |
| 2021/0405440 A1 | 12/2021 | Yu et al. |
| 2021/0405446 A1 | 12/2021 | Yu |
| 2021/0408499 A1 | 12/2021 | Li et al. |
| 2022/0140040 A1* | 5/2022 | Zhang .................... H10K 71/00 257/40 |
| 2022/0310742 A1* | 9/2022 | Yi ........................ G09G 3/3291 |

FOREIGN PATENT DOCUMENTS

| | | | |
|---|---|---|---|
| CN | 108919545 | A | 11/2018 |
| CN | 109100892 | A | 12/2018 |
| CN | 110365819 | A | 10/2019 |
| CN | 110520919 | A | 11/2019 |
| CN | 110646962 | A | 1/2020 |
| CN | 110687710 | A | 1/2020 |
| CN | 110716340 | A | 1/2020 |
| CN | 110750021 | A | 2/2020 |
| CN | 111047967 | A | 4/2020 |
| CN | 111129102 | A | 5/2020 |
| CN | 111180490 | A | 5/2020 |
| CN | 111258096 | A | 6/2020 |
| CN | 111261684 | A | 6/2020 |
| CN | 112271205 | A | 1/2021 |

* cited by examiner

192

194

196

DISPLAY PANEL, DISPLAY DEVICE, AND METHOD FOR MANUFACTURING A DISPLAY PANEL

RELATED APPLICATION

The present application is a 35 U.S.C. 371 national stage application of PCT International Application No. PCT/CN2021/084506, filed on Mar. 31, 2021, the entire disclosure of which is incorporated herein by reference.

FIELD

This disclosure relates to the field of display technology, and more particularly to a display panel, a display device, and a method for manufacturing a display panel.

BACKGROUND

With the development of science and technology and the improvement of living standards, a variety of display devices enrich production and life. Common display devices include LCD (liquid crystal display) based display devices, OLED (organic light emitting diode) based display devices, etc.

Increasing the proportion of screen is one of the development trends of display devices. The plane where the display screen of some display devices is located needs to perform image acquisition at the same time, so the space for camera installation often needs to be reserved on the display screen, which limits the further improvement of the screen proportion, increases the manufacturing difficulty of the display screen and reduces the yield of the display screen.

SUMMARY

In an aspect, a display panel is provided, comprising: a first display area, comprising a plurality of first light emitting units and a first driving layer for driving the plurality of first light emitting units; and a second display area, at least partially surrounded by the first display area, and making ambient light at least partially transmitted, wherein the first driving layer comprises a first light shielding pattern, the first light shielding pattern at least partially surrounding the second display area and comprising a hollow structure which exposes at least part of the second display area.

In some embodiments, the second display area comprises a plurality of second light emitting units and a second driving layer for driving the plurality of second light emitting units, wherein the display panel further comprises a frame area located on the periphery of the display panel, the frame area comprising a driving device for driving the plurality of second light emitting units, and wherein the second driving layer comprises a transparent wiring area, the plurality of second light emitting units are electrically connected to the driving device through the transparent wiring area.

In some embodiments, a density of light emitting regions of the plurality of first light emitting units is arranged to be not less than a density of light emitting regions of the plurality of second light emitting units.

In some embodiments, the first display area comprises: a first substrate, on which the first driving layer is located, the plurality of first light emitting units being located on a side of the first driving layer away from the first substrate, and the plurality of first light emitting units comprising a plurality of first anodes. The first driving layer comprises: a driving circuit unit on the first substrate, the driving circuit unit comprising a thin film transistor; a first conductive layer comprising a first electrode and a second electrode, the first electrode and the second electrode acting as source and drain of the thin film transistor; a first planarization layer on the first conductive layer; and a second conductive layer on the first planarization layer, the second conductive layer comprising a plurality of first patterns and the first light shielding pattern, one of the plurality of first patterns being connected to the first electrode of the corresponding thin film transistor through a via hole in the first planarization layer, and one of the first patterns being electrically connected with a corresponding one of the plurality of first anodes.

In some embodiments, the first light shielding pattern is connected to a first voltage wiring through a via hole.

In some embodiments, the plurality of second light emitting units comprise a plurality of second anodes, wherein the second display area comprises a second substrate on which the second driving layer is located, the plurality of second light emitting units being located on a side of the second driving layer away from the second substrate, each of the plurality of second anodes is electrically connected to a corresponding driving device through a transparent wiring in the transparent wiring area.

In some embodiments, the first display area further comprises: at least one planarization layer on the second conductive layer, wherein one of the plurality of first anodes is electrically connected with the first electrode of the thin film transistor via the via hole passing through the at least one planarization layer.

In some embodiments, an orthographic projection of the first light shielding pattern on the first display area is a part of a ring shape, the ring shape surrounds the second display area and a difference between inner and outer radii of the ring is 200-800 μm.

In some embodiments, the first pattern is electrically insulated from the first light shielding pattern, and an orthographic projection of the first pattern on the first display area does not overlap with an orthographic projection of the first light shielding pattern on the first display area.

In some embodiments, the first driving layer comprises: a capacitor comprising a first electrode plate and a second electrode plate, the second electrode plate being electrically connected to the first voltage wiring directly; an initialization transistor providing an initialization voltage in response to a reset signal; and a switching part, one end of the switching part being connected to the first electrode plate and the other end is connected to a second electrode of the initialization transistor, and wherein an orthographic projection of the first light shielding pattern on the first display area at least partly overlaps with an orthographic projection of the switching part on the first display area.

In some embodiments, the display panel further comprises: a second light shielding pattern arranged on a side of the second display area close to the frame area, the second light shielding pattern at least partially surrounding the second display area and exposing at least part of the second display area.

In some embodiments, an orthographic projection of the second light shielding pattern on the second display area does not overlap with the second display area, the second light shielding pattern comprises an opening area, a distance between the opening area and the second display area is greater than 10 μm.

In some embodiments, the plurality of second light emitting units comprises a plurality of second anodes, the second light shielding pattern and the plurality of second anodes are arranged in a same layer.

In some embodiments, the plurality of second light emitting units further comprise a second cathode layer corresponding to the plurality of second anodes, the second light shielding pattern and the plurality of second anodes are insulated from each other, and the second light shielding pattern is electrically connected to the second cathode layer.

In another aspect, a display device is provided, comprising: a display panel according to any of the preceding claims; and an image acquisition device located on an opposite side of a light exit side of the display panel, wherein at least part of light transmitting regions of the second display area is in a field of view of the image acquisition device.

In some embodiments, an orthographic projection of the first light shielding pattern on the first display area is a part of a ring shape, and a size of the ring shape in the radial direction is one fifteenth to four fifteenth of a diameter of the image acquisition device in a field of view area of the display panel.

In a further aspect, a method for manufacturing a display panel is provided, comprising: forming a first display area and a second display area, the first display area comprising a plurality of first light emitting units and a first driving layer for driving the plurality of first light emitting units; the second display area being at least partially surrounded by the first display area, and making ambient light at least partially transmitted, wherein the first driving layer comprises a first light shielding pattern, the first light shielding pattern at least partially surrounding the second display area and comprising a hollow structure which exposes at least part of the second display area.

DETAILED DESCRIPTION OF THE DRAWINGS

In order to explain the technical solutions in the embodiments of the present disclosure more clearly, the accompanying drawings to be used in the description of the embodiments will be briefly introduced below. Obviously, the drawings described below are only some embodiments of the present disclosure.

Figure 2A:
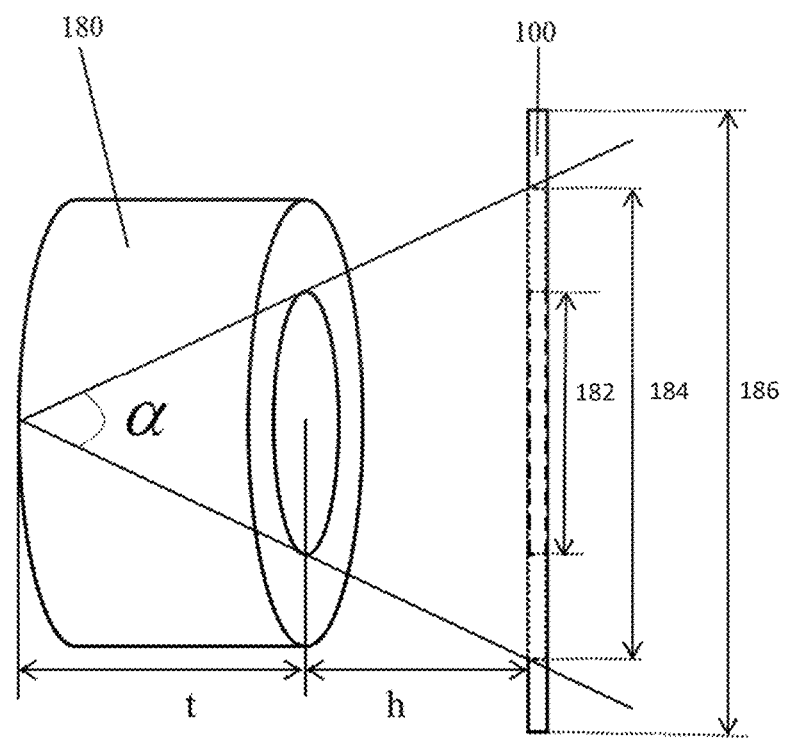
Figure 2B:
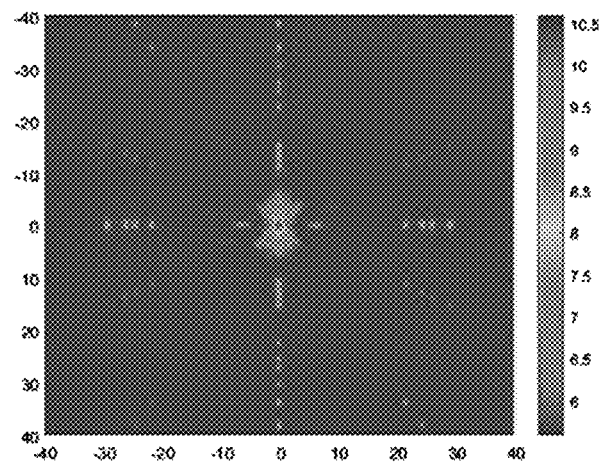
Figure 2B:
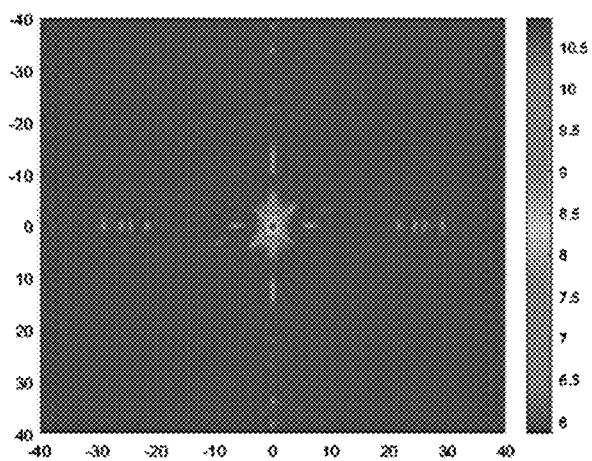
Figure 2B:
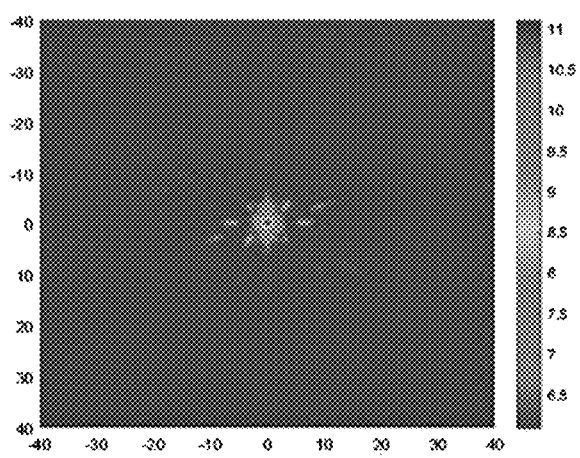
Figure 2C:
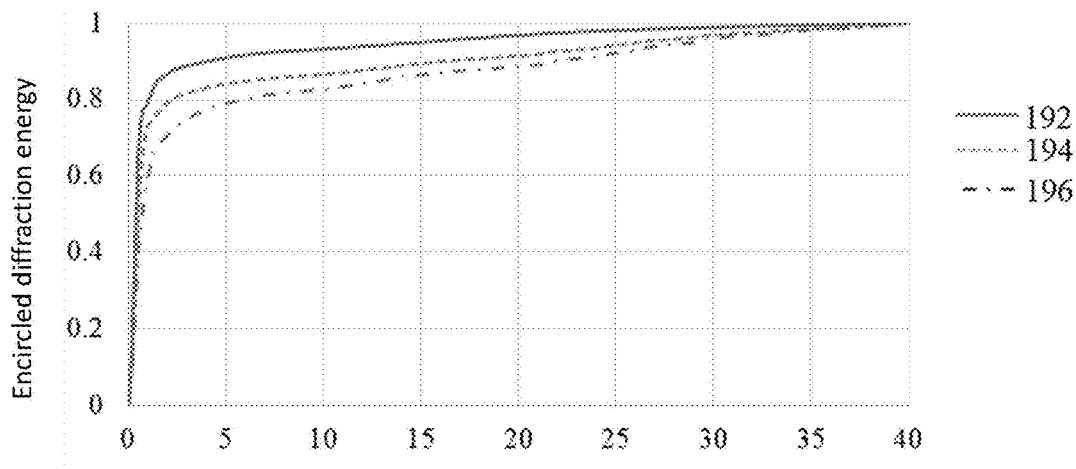
Figure 2D:
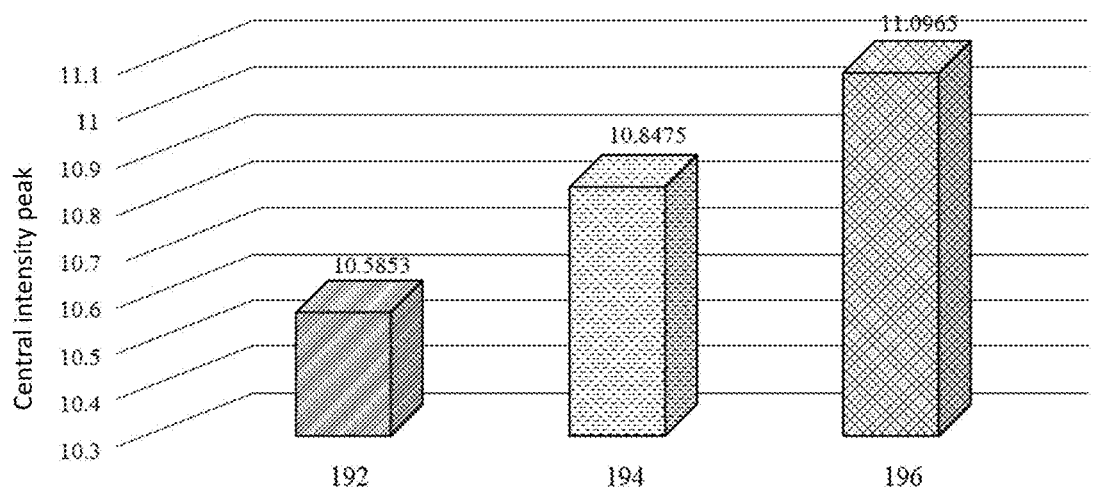
Figure 3A:
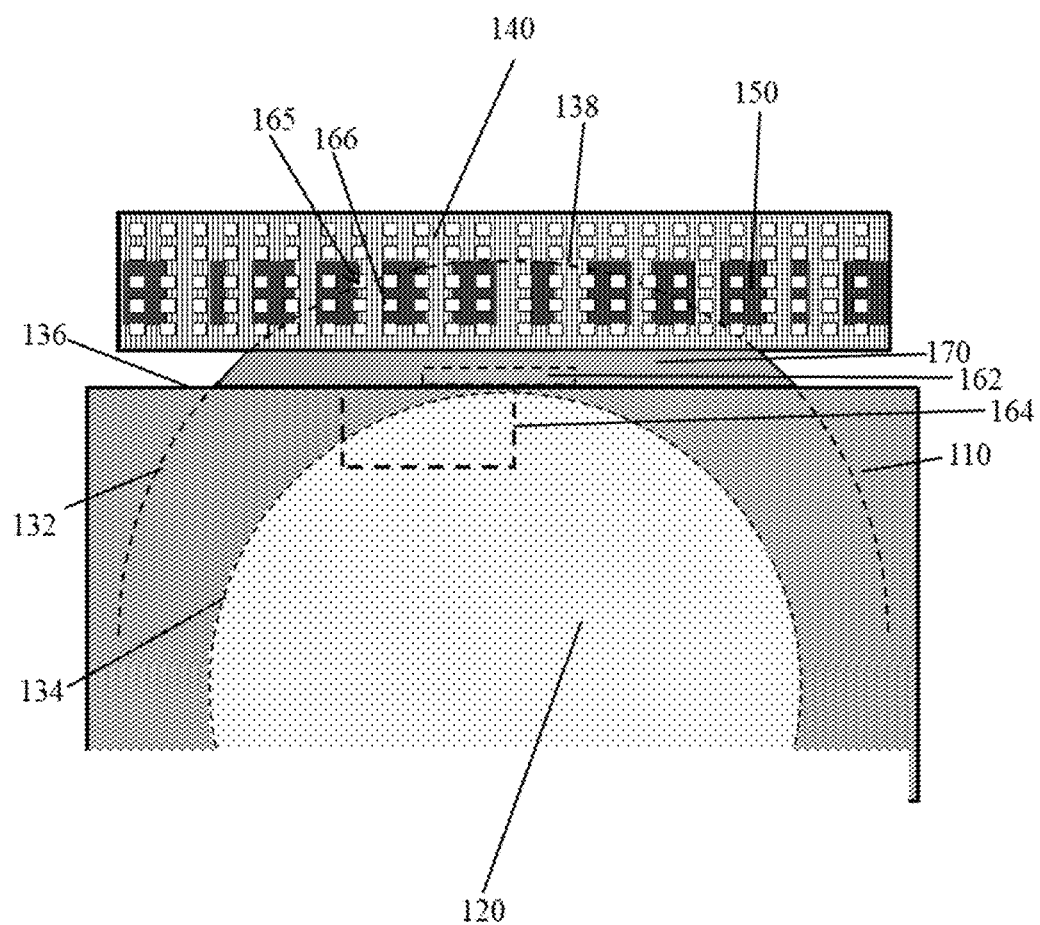
Figure 3B:
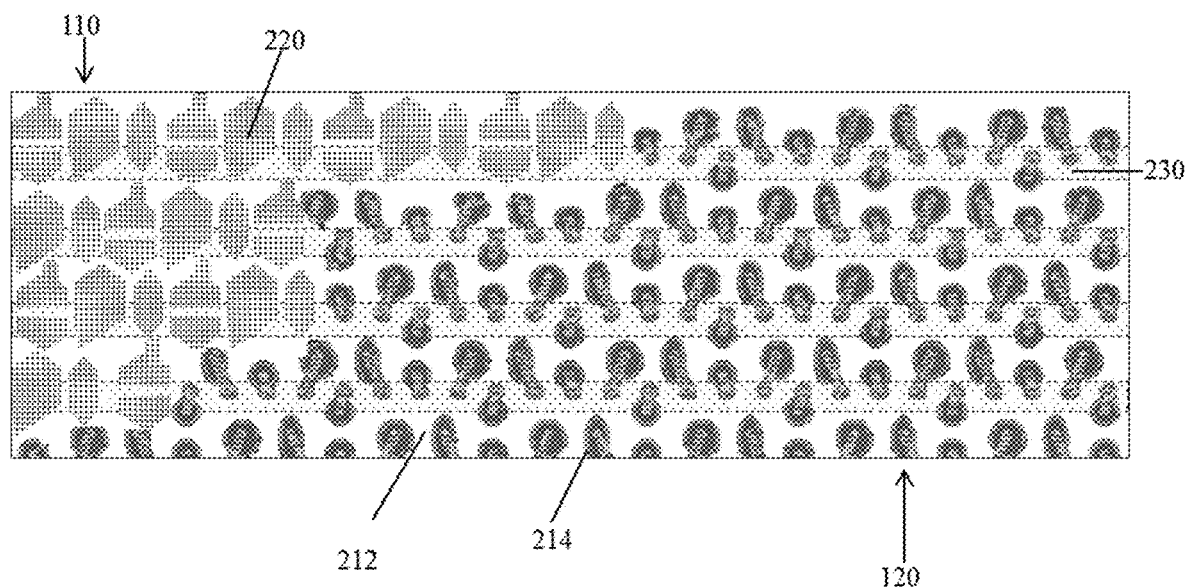
Figure 4:
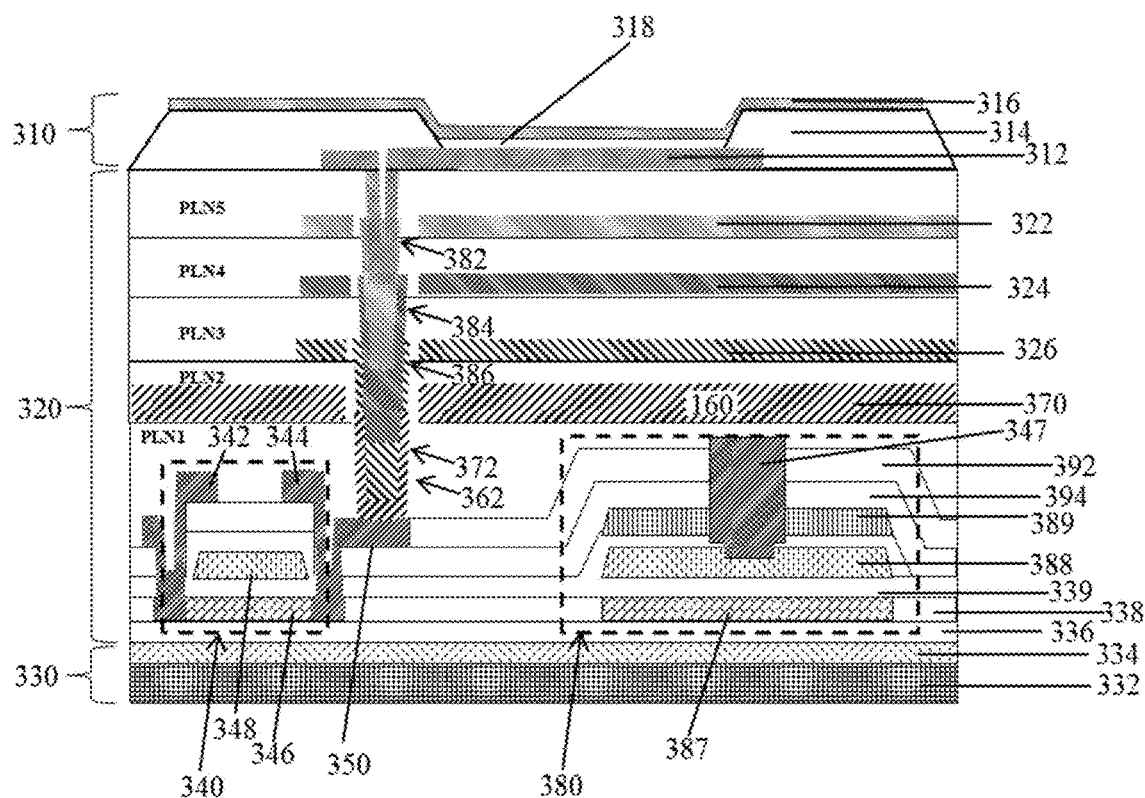
Figure 5:
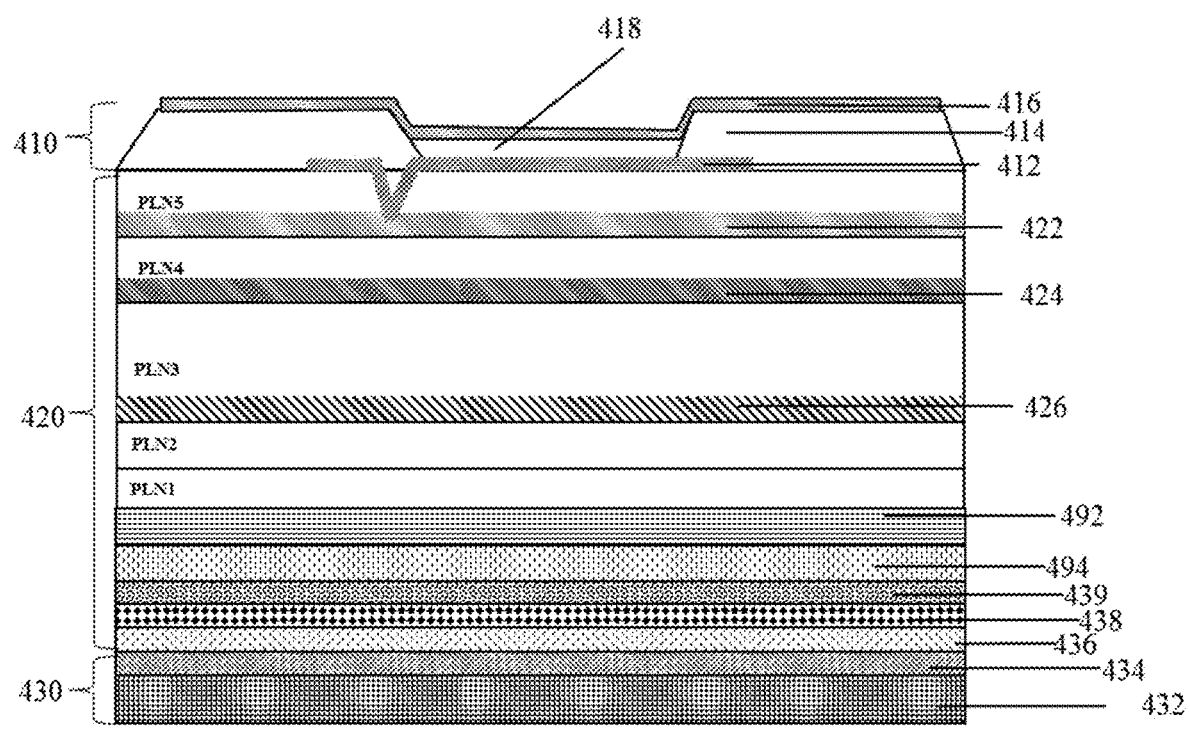
Figure 6:
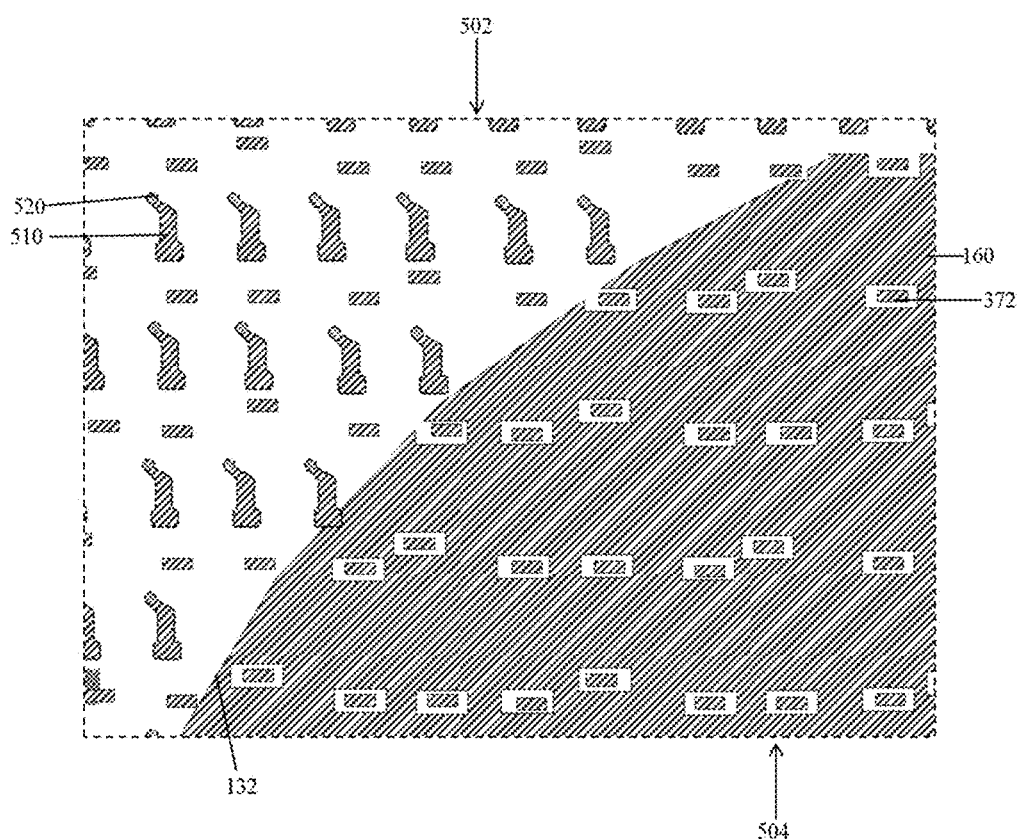
Figure 7:
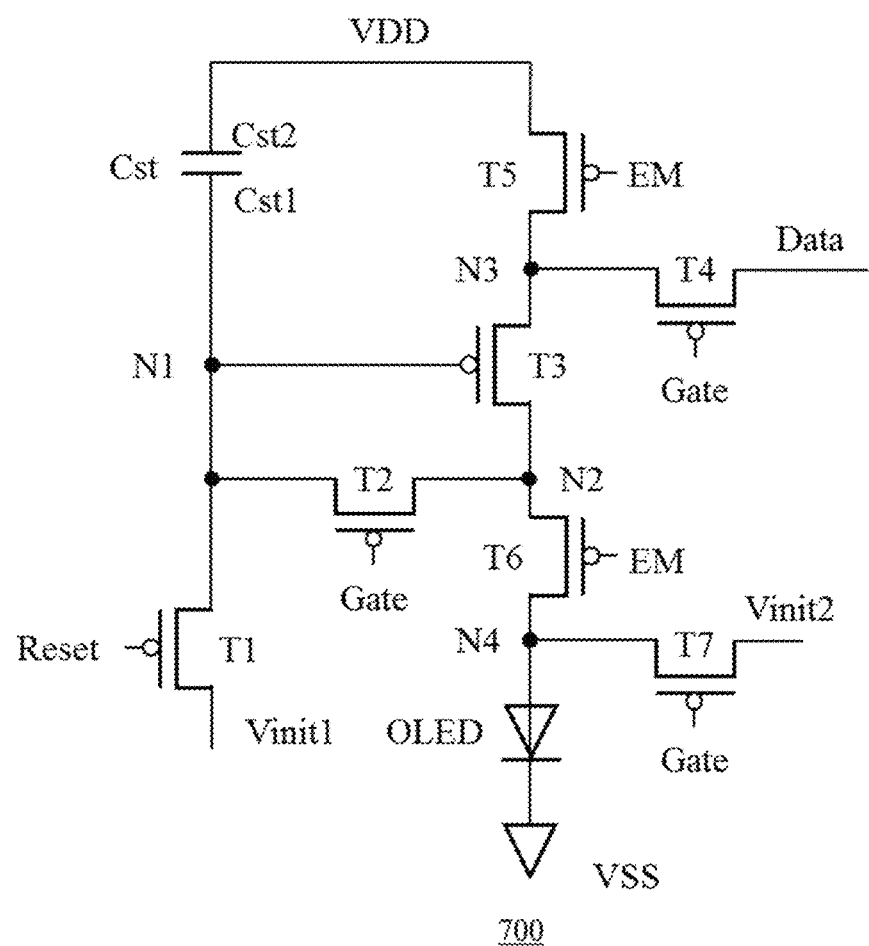
Figure 8:
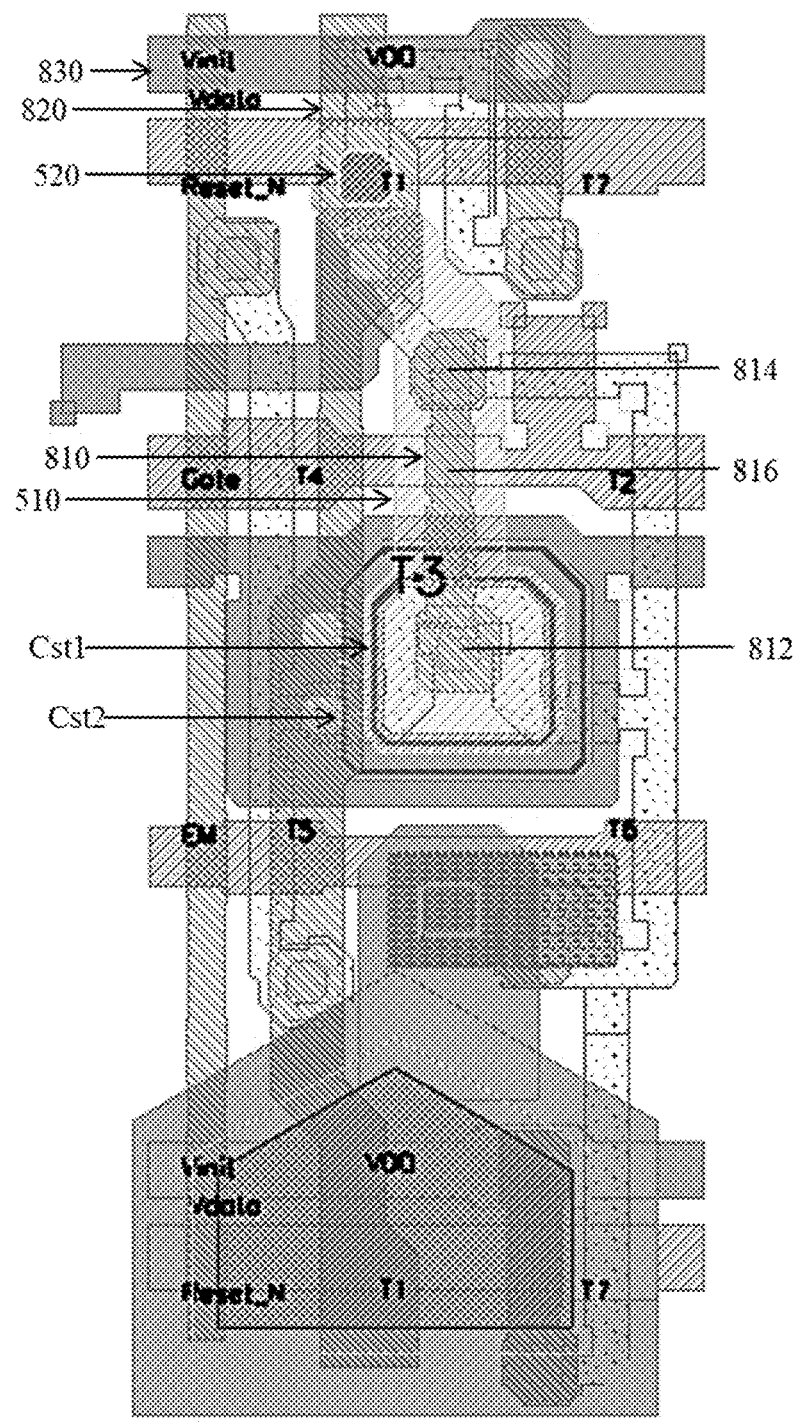
Figure 9:
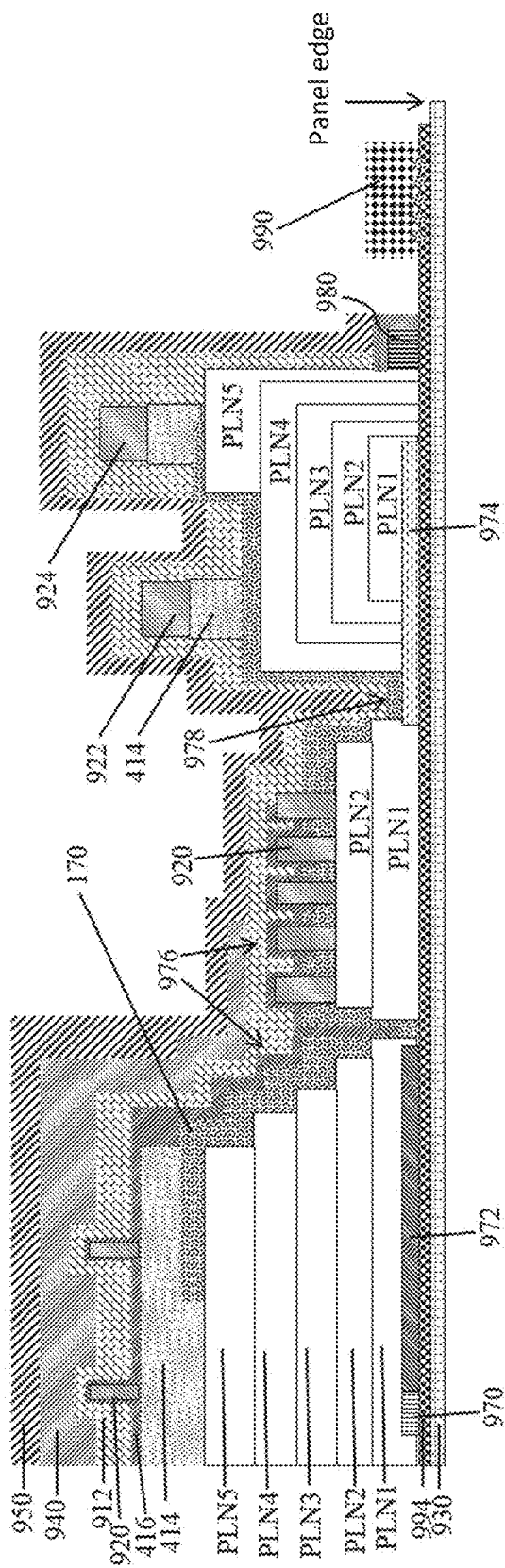
Figure 10:
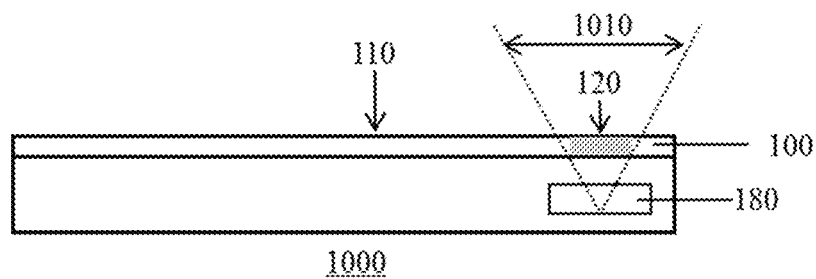

FIG. 1 schematically shows a plan structural diagram of a display panel according to some embodiments of the present disclosure;

FIG. 2a schematically shows a schematic diagram of an image acquisition device according to some embodiments of the present disclosure;

FIGS. 2b-2d schematically show image acquisition quality simulation results in the case of different second display area sizes according to some embodiments of the present disclosure;

FIG. 3a schematically shows a schematic diagram of the second display area shown in FIG. 1 and its surrounding structure;

FIG. 3b schematically shows an enlarged view of the portion marked by the dotted box in FIG. 3a;

FIG. 4 schematically shows a cross-sectional view taken along the first display area in FIG. 1 according to some embodiments of the present disclosure;

FIG. 5 schematically shows a cross-sectional view taken along the second display area in FIG. 1 according to some embodiments of the present disclosure;

FIG. 6 shows a plan schematic diagram of the boundary of the first light shielding pattern and its related structure in the second conductive layer according to some embodiments of the present disclosure;

FIG. 7 schematically shows a schematic diagram of a pixel driving circuit according to some embodiments of the present disclosure;

FIG. 8 schematically shows a wiring diagram of a pixel driving circuit according to some embodiments of the present disclosure;

FIG. 9 schematically shows a cross-sectional view of a frame area according to some embodiments of the present disclosure; and FIG. 10 schematically shows a schematic diagram of a display device according to some embodiments of the present disclosure.

EMBODIMENTS

In order to make the purpose, technical solutions and advantages of the embodiments of the present disclosure more clear, the technical solutions of the embodiments of the present disclosure will be further described in detail below in combination with the accompanying drawings.

It should be understood that although the terms first, second, third, etc. can be used herein to describe various elements, components and/or parts, these elements, components and/or parts should not be limited by these terms. These terms are used only to distinguish one element, component or part from another. Therefore, the first element, component or part discussed below may be referred to as a second element, component or part without departing from the teaching of the present disclosure.

The terms used herein are for the purpose of describing specific embodiments only and are not intended to limit the present disclosure. As used herein, the singular forms "a", "one" and "the" are intended to include the plural unless otherwise indicated clearly in the context. It will be further understood that the terms "comprise" and/or "include", when used in this Specification, specify the presence of the described features, entireties, steps, operations, elements and/or components, while not excluding presence of one or more other features, entireties, steps, operations, elements, components and/or groups thereof or adding one or more other features, entirety, steps, operations, elements, components and/or groups thereof. As used herein, the term "and/or" includes any and all combinations of one or more of the associated listed items.

Under-screen camera technology is a technology that sets image acquisition devices (such as cameras) below the display screen (i.e. the side opposite to the light exit side of the display screen). By adopting the under-screen camera technology, there is no need to reserve space for installing image acquisition devices on the screen (for example, there is no need to set an area without display pictures on the display screen), so as to achieve a higher screen proportion, maintain the integrity of the display screen, reduce the process difficulty and improve the yield.

The inventor of the present application realized that one way to realize the under-screen camera technology is to enable the external ambient light to enter the image acquisition device arranged below the display screen through the gaps between the pixels of the display screen, so as to carry out image acquisition and imaging. On the one hand, the under-screen camera technology needs to meet the normal display function of the display area; on the other hand, it also needs to meet the conditions of image acquisition: it has a certain transmittance and allows the light to be collected to be projected onto the photosensitive element of the image acquisition device. The inventor of the present application further found that light will diffract under certain conditions, resulting in the change of propagation path, thereby causing the light outside the normal image acquisition range of the image acquisition element also to enter the image acquisition element, which results in the phenomenon such as rays of light and halo.

The inventor of the present application realized that the above phenomenon can be effectively reduced by using a light shielding layer for oblique field angle shielding outside the normal image acquisition range of the image acquisition device. The light shielding layer is generally made of metal or composite materials, which can effectively reflect light. The inventor of the present application further found that the shielding methods can be roughly divided into two types: the first is to use the signal wiring shielding in the display screen, although the signal wiring shielding makes maximum use of the existing resources, there is easy to have gaps between the wirings and there is still diffraction phenomenon; the second is to set the whole piece of material for shielding, in this way, you can choose to set a metal material layer or a composite material layer. For example, the composite material layer is the super clean foam (SCF) of the module section, but its opening manufacturing accuracy and fitting alignment accuracy are in mm level, which affects its light shielding effect. The metal material layer can be well integrated with the device, and the light shielding area is large, so it is an excellent choice of the light shielding layer.

FIG. 1 schematically shows a plan structural diagram of a display panel according to some embodiments of the present disclosure. As shown in FIG. 1, the display panel comprises a display area 105 comprising a first display area 110 and a second display area 120. FIG. 2a schematically shows a schematic diagram of an image acquisition device according to some embodiments of the present disclosure. FIGS. 2b-2d schematically show image acquisition quality simulation results in the case of different second display area sizes according to some embodiments of the present disclosure. FIG. 2b schematically shows an imaging effect in the case of different second display area sizes according to some embodiments of the present disclosure, FIG. 2c schematically shows the encircled diffraction energy in the case of different second display area sizes according to some embodiments of the present disclosure, and FIG. 2d schematically shows a central intensity peak in the case of different second display area sizes according to some embodiments of the present disclosure. The image acquisition device 180 is arranged on one side of the display panel 100 (usually the opposite side of the display side). As shown in FIG. 2a, the field angle of the image acquisition device 180 is $\alpha$, the field angle depth is t, and the distance from the side of the image acquisition device 180 close to the display panel 100 to the display panel 100 is h. The diameter of the field of view area 184 of the image acquisition device 180 on the display panel 100 is $r=(t+h)*\tan(\alpha/2)*2$. r may correspond to the minimum diameter of the area in the display panel 100 for light input by the image acquisition device 180. Within the range of the field angle $\alpha$, if the display panel 100 has no metal wiring in the field of view area 184, light diffraction will not occur, and then the image acquisition device 180 will not have a starburst image during image acquisition. For example, $\alpha=80°$, $t=1.487$ mm, $h=0.3$ mm, then $r=3.0$ mm can be obtained. When the diameter of the area (second display area 120) for light input by the image acquisition device 180 in the display panel 100 is greater than 3 mm (as shown by reference numeral 186), within the range of a, the image acquisition is good. When the diameter of the area (second display area 120) for light input by the image acquisition device 180 in the display panel 100 is less than 3 mm (as shown by reference numeral 182), within the range of a, there will be metal wiring in the area between reference numerals 182 and 184, which will interfere with the propagation of light, resulting in poor image acquisition effect.

FIGS. 2b to 2d show simulation diagrams of image acquisition effects for different diameters of the second display area 120. The simulation conditions are: $h=0.3$ mm, $\alpha=14°$, based on double Gaussian 28° lens. Three different diameters of the second display area 120 are used in the simulation: lens aperture 192, lens aperture+0.3 mm 194 and lens aperture+0.6 mm 196. In FIG. 2b, the abscissa refers to the position ($\mu$m), the ordinate refers to the relative intensity of light. In FIG. 2c, the abscissa refers to the position from the center ($\mu$m), the ordinate refers to the relative magnitude of the encircled diffraction energy. In FIG. 2d, the ordinate refers to the central intensity peak. As can be seen from FIG. 2b to FIG. 2d, the larger the diameter of the second display area 120, the weaker the light diffraction, the fewer bad spots, the better the light focusing effect and the better the photographing effect. At the same time, the larger the diameter of the second display area 120, the higher the central intensity, which is conducive to a good photographing effect.

However, due to the limitation of wiring space in the second display area 120, in some cases, the size of the second display area 120 is limited. In combination with the actual wiring situation, the diameter of the second display area 120 may be less than the desired size. For example, in the event that $\alpha=80°$, $t=1.487$ mm, $h=0.3$ mm, $r=3.0$ mm, the maximum diameter of the second display area 120 can only achieve 2.78 mm, which is not ideal. In this case, since there will be metal wiring between the areas indicated by reference numerals 182 and 184, this will interfere with the propagation of light, resulting in poor image acquisition effect.

FIG. 3a schematically shows the second display area shown in FIG. 1 and its surrounding structure. FIG. 3b schematically shows an enlarged view of the portion marked by the dotted box 164 in FIG. 3a. FIG. 4 schematically shows a cross-sectional view taken along the first display area in FIG. 1 according to some embodiments of the present disclosure. As shown in FIGS. 1-4, an embodiment of the present disclosure provides a display panel 100, comprising: a first display area 110 which comprises a plurality of first light emitting units 310 and a first driving layer 320 for driving the plurality of first light emitting units 310; and a second display area 120, at least partially surrounded by the first display area 110, and making ambient light at least partially transmitted, wherein the first driving layer 320 comprises a first light shielding pattern 160, the first light shielding pattern 160 at least partially surrounding the second display area 120 and comprising a hollow structure (an area surrounded by the second boundary line 134 in a direction away from the first boundary line 132), which exposes at least part of the second display area 120.

For example, as shown in FIG. 1, the first light shielding pattern 160 comprises an area surrounded by a first boundary line 132, a second boundary line 134, and an upper boundary line 136 of the display area. It should be understood that the second boundary line 134 does not necessarily coincide with the boundary between the first display area 110 and the second display area 120. As shown in FIGS.

3a-3b, the first display area 110 comprises light emitting regions (display pixels) 220 of a plurality of first light emitting units and a driving circuit unit (not shown), etc., and the second display area 120 comprises light emitting regions (display pixels) 214 of a plurality of second light emitting units and light transmitting regions 212 between light emitting regions 214 of the plurality of second light emitting units. It should be understood that since the first light shielding pattern is arranged in the first driving layer 320, it is schematically shown with a dotted line.

It should be understood that in the description of the present disclosure, the term "a plurality of first light emitting units" is used to indicate the light emitting pixels (light emitting devices) distributed in an array, and the term "first driving layer" is used to indicate a layer including various wirings providing light emitting driving signals and electric power for the plurality of first light emitting units, which may include, for example, a driving circuit unit.

By setting the first light shielding pattern to at least partially surround the second display area and expose at least part of the second display area, the influence of light diffraction generated by wiring, etc. in the first display area on image acquisition can be reduced and blocked, unwanted light can be blocked and image acquisition quality can be improved. In this way, high image acquisition quality can be obtained even when the size of the second display area is limited. At the same time, since the first light shielding pattern is arranged in the first driving layer, the wiring layer in the first driving layer can be effectively used to realize the multiplexing of the wiring layer of the same layer without arranging an additional light shielding layer. In this way, the number of patterning processes is reduced, the preparation efficiency and yield are effectively improved, and the cost is reduced.

FIG. 5 schematically shows a cross-sectional view taken along the second display area in FIG. 1 according to some embodiments of the present disclosure. Referring to FIGS. 1-5, the second display area 120 may comprise a plurality of second light emitting units 410 and a second driving layer 420 for driving the plurality of second light emitting units 410. The display panel 100 further comprises a frame area 140 located at the periphery of the display panel, the frame area 140 comprising driving devices 150 for driving the plurality of second light emitting units 410, and wherein the second driving layer 420 comprises transparent wiring areas 230, the plurality of second light emitting units 410 are electrically connected to the driving devices 150 through the transparent wiring areas 230. It should be understood that since the transparent wiring areas 230 are arranged in the second driving layer 420, it is schematically shown with a dotted line in FIG. 3b. It should be understood that the specific number of transparent wiring areas can be set by those skilled in the art according to the needs of signal transmission, which is not limited in the present disclosure.

It should be understood that in the description of the present disclosure, the term "a plurality of second light emitting units" is used to indicate the light emitting pixels (light emitting devices) distributed in an array, and the term "second driving layer" is used to indicate a layer including various wirings providing light emitting driving signals and electric power for the plurality of second light emitting units, which may include, for example, a driving circuit unit.

Through such a setting, the frame area comprises driving devices for driving the plurality of second light emitting units, the driving devices of the plurality of second light emitting units in the second display area are moved into the frame area, and are connected with the plurality of second light emitting units through the transparent wiring areas, so as to prevent the driving devices from blocking light in the second display area and affecting the light transmittance. In this way, the light transmittance is further improved and the image acquisition quality is improved.

In some embodiments, as shown in FIGS. 1 to 3b, the second display area 120 comprises light transmitting regions 212, and an orthographic projection of the first light shielding pattern 160 in the second display area 120 does not overlap with orthographic projections of the light transmitting regions 212 of the second display area 120 in the second display area 120. In this way, the first light shielding pattern 160 is not provided in the second display area 120 to avoid the influence of the first light shielding pattern 160 on image acquisition.

Generally speaking, the area closer to the center of the image acquisition area has a greater impact on the image acquisition quality. Therefore, in some embodiments, the second boundary line 134 may be close to the boundary between the first display area 110 and the second display area 120, that is, the second boundary line 134 may approximately coincide with the boundary between the first display area 110 and the second display area 120. In this way, the wiring of the second display area close to the first display area and the adverse effects of other structures, such as diffracted light or other unwanted light, can be shielded as much as possible.

In some embodiments, as shown in FIG. 3b, the density of the light emitting regions 220 of the plurality of first light emitting units is arranged to be not less than the density of the light emitting regions 214 of the plurality of second light emitting units. "Density" here refers to the size of the area occupied by the light emitting regions 220 of the plurality of first light emitting units or the light emitting regions 214 of the plurality of second light emitting units in the display area of the same area. With this arrangement, there are more gaps between the light emitting regions 214 of the plurality of second light emitting units, which further improves the light transmittance and improves the image acquisition quality.

In some embodiments, as shown in FIG. 4, the first display area 110 comprises: a first substrate 330, on which the first driving layer 320 is located, the plurality of first light emitting units 310 being located on a side of the first driving layer 320 away from the first substrate 330, and the plurality of first light emitting units 310 comprising a plurality of first anodes 312 (e.g., anodes of OLED devices). The first driving layer 320 comprises: a driving circuit unit on the first substrate, the driving circuit unit comprising a thin film transistor 340; a first conductive layer 350 comprising a first electrode 344 and a second electrode 342, the first electrode 344 and the second electrode 342 acting as the source and drain of the thin film transistor 340; a first planarization layer PLN1 on the first conductive layer 350; and a second conductive layer 370 on the first planarization layer PLN1, the second conductive layer 370 comprising a plurality of first patterns 372 and the first light shielding pattern 160, one of the plurality of first patterns 372 being connected to the first electrode 344 of the corresponding thin film transistor 340 through a via hole 362 in the first planarization layer PLN1, and one of the first patterns 372 being electrically connected with a corresponding one of the plurality of first anodes 312. In this way, since the first light shielding pattern 160 is arranged in the first driving layer 320 and the second conductive layer comprises a plurality of first patterns and a first light shielding pattern, the wiring layer in the first driving layer (in particular, the second conductive layer, the first conductive layer, etc.) can be effectively multiplexed to realize the efficient and full utilization of the wiring layer of the same layer without setting an additional light shielding layer. In this way, the number of patterning processes is reduced, the preparation efficiency and yield are effectively improved, and the cost is reduced. At the same time, the first patterns 372 comprised in the second conductive layer act as a lapping part for the electrical connection between the first anode 312 and the first electrode 344 of the thin film transistor 340, so as to improve the reliability of lapping.

FIG. 6 shows a plan schematic diagram of the boundary of the first light shielding pattern and its related structure in the second conductive layer according to some embodiments of the present disclosure. In FIG. 6, through the first boundary line 132 of the first light shielding pattern 160, the display panel can be divided into two areas, that is, the area 504 provided with the first light shielding pattern 160 and the area 502 not provided with the first light shielding pattern 160. In some embodiments, as shown in FIG. 6, the first light shielding pattern 160 plays the function of light shielding and basically covers the area 504 provided with the first light shielding pattern 160. "Basically" here can mean that the first light shielding pattern 160 covers 50% to nearly 100% of the area of the area 504 provided with the first light shielding pattern 160, such as 60%, 80%, 90%, 95%, 99%, etc.

In some embodiments, in the area 502, the second conductive layer may further comprise a second pattern 510, which may be connected to a first voltage wiring, such as a VDD signal line, through a via hole 520 (see FIG. 8).

In some embodiments, in the area 504, the first light shielding pattern 160 may be connected to a first voltage wiring, such as a VDD signal line, through a via hole (not shown) (also see FIG. 8). For example, in the area of the first light shielding pattern 160, for the corresponding position of each pixel, the first light shielding pattern 160 is electrically connected with the VDD signal of the first conductive layer through a via hole, and the via hole through which the first light shielding pattern 160 is electrically connected with the first conductive layer may be set similarly to the via hole 520. In this case, the first light shielding pattern 160 may be arranged to have a concave structure at the position of the via hole.

In some embodiments, the first pattern 372 acts as a lapping part for the electrical connection between the first anode 312 and the first electrode 344 of the thin film transistor 340, and the first pattern 372 is electrically insulated from the first light shielding pattern 160. In some embodiments, as shown in FIG. 6, the orthographic projection of the first pattern 372 on the first display area 110 does not overlap with the orthographic projection of the first light shielding pattern 160 on the first display area 110, that is, the first pattern 372 can be physically separated from the first light shielding pattern 160.

By setting the first light shielding pattern 160 to basically cover the area 504 provided with the first light shielding pattern 160 and the electrical insulation between the first pattern 372 and the first light shielding pattern 160, the first light shielding pattern 160 (and possibly the first pattern 372) jointly plays the role of light shielding, can play a good light shielding effect, and the first light shielding pattern 160 will not be shorted to the first anode 312.

In some embodiments, as shown in FIG. 5, the plurality of second light emitting units 420 comprises a plurality of second anodes 412 (e.g., anodes of OLED devices). The second display area comprises a second substrate 430, on which the second driving layer 420 is located, and the plurality of second light emitting units 410 are located on a side of the second driving layer 420 away from the second substrate 430. The second driving layer 420 may comprise at least one planarization layer (for example, a second planarization layer PLN2 on the second substrate 430, a third conductive layer 426 on the second planarization layer, a third planarization layer PLN3 on the third conductive layer 426, a fourth conductive layer 424 on the third polarization layer PLN3, a fourth planarization layer PLN4 on the fourth conductive layer 424, a fifth conductive layer 422 on the fourth planarization layer PLN4, a fifth planarization layer PLN5 on the fifth conductive layer 422) and transparent wiring areas arranged in at least one planarization layer (for example, the third conductive layer 426, the fourth conductive layer 424 and the fifth conductive layer 422 comprise transparent wiring areas 230 respectively), each of the plurality of second anodes 412 being electrically connected to a corresponding driving device through the transparent wiring in the transparent wiring areas. By arranging the third conductive layer 426, the fourth conductive layer 424 and the fifth conductive layer 422, and the frame area comprising driving devices for driving a plurality of second light emitting units, the driving devices of the plurality of second light emitting units in the second display area can be connected with the plurality of second light emitting units through the transparent wiring areas 230 comprised in the third conductive layer 426, the fourth conductive layer 424 and the fifth conductive layer 422, so as to prevent the driving devices from arranging in the second display area to block light and affect the light transmittance.

For example, in FIG. 5, the second anodes 412 of the plurality of second light emitting units 410 are electrically connected to the fifth conductive layer 422. The second anodes corresponding to other pixels can be connected to different conductive layers as needed, such as the third conductive layer 426 or the fourth conductive layer 424, so as to make the best use of the wiring space.

In some embodiments, the transparent wiring areas comprise at least one of indium tin oxide (ITO), indium zinc oxide (IZO), and indium gallium zinc oxide (IGZO).

In some embodiments, as shown in FIG. 4, the first display area 110 further comprises: at least one planarization layer on the second conductive layer 370 (for example, a second planarization layer PLN2 on the second conductive layer 370, a third conductive layer 326 on the second planarization layer PLN2, a third planarization layer PLN3 on the third conductive layer 326, a fourth conductive layer 324 on the third planarization layer PLN3, a fourth planarization layer PLN4 on the fourth conductive layer 324, a fifth conductive layer 322 on the fourth planarization layer PLN4, and a fifth planarization layer PLN5 on the fifth conductive layer 322), wherein one of the plurality of first anodes 312 is electrically connected to the first electrode 344 of the thin film transistor 340 via a via hole 362 passing through at least one planarization layer (e.g., the first planarization layer PLN1, the second planarization layer PLN2, the third planarization layer PLN3, the fourth planarization layer PLN4, and the fifth planarization layer PLN5). Since the first anode 312 is electrically connected with the first electrode 344 of the thin film transistor 340 across a large number of layers, when making the third conductive layer 326, the fourth conductive layer 324 and the fifth conductive layer 322, the lapping parts 382, 384 and 386 for assisting the first anode 312 to be electrically connected with the first electrode 344 of the thin film transistor 340 through the via hole 362 can be made in the same layer, so as to improve the reliability of lapping. It should be understood that, as shown in FIG. 4, when making the third conductive layer 326, the fourth conductive layer 324 and the fifth conductive layer 322, the lapping parts 382, 384 and 386 made in the same layer are insulated from the third conductive layer 326, the fourth conductive layer 324 and the fifth conductive layer 322. In some embodiments, the third conductive layer 326, the fourth conductive layer 324, and the fifth conductive layer 322 may act as transparent wiring in the transparent wiring areas 230.

It should be understood that in the present disclosure, the term "same layer" refers to the formation using the same patterning process, for example, the first element and the second element being in the same layer refers to that the first element and the second element can be formed simultaneously in the same patterning process.

In some embodiments, as shown in FIG. 5, the second display area 120 further comprises a first planarization layer PLN1 between the second substrate 430 and the second planarization layer PLN2. It should be understood that the first planarization layer, the second planarization layer, the third planarization layer, the fourth planarization layer and the fifth planarization layer comprised in the first display area can be arranged in the same layer as the first planarization layer, the second planarization layer, the third planarization layer, the fourth planarization layer and the fifth planarization layer comprised in the second display area, respectively. The third conductive layer 326, the fourth conductive layer 324 and the fifth conductive layer 322 comprised in the first display area may be arranged in the same layer as the third conductive layer 426, the fourth conductive layer 424 and the fifth conductive layer 422 comprised in the second display area, respectively. In some embodiments, the third conductive layer 426, the fourth conductive layer 424, and the fifth conductive layer 422 may act as transparent wiring in the transparent wiring areas 230.

In some embodiments, the second conductive layer may include a metal material or other conductive materials, for example, a TiAl multilayer structure, such as a Ti—Al composite film layer, a Ti—Al—Ti composite film layer, or the like. This kind of materials can have good electrical properties and processability, and can provide good shielding effect.

In some embodiments, as shown in FIGS. 1-6, the orthographic projection of the first light shielding pattern 160 on the first display area 110 is a part of a ring shape, the ring shape surrounds the second display area 120, and the difference between the inner and outer radii of the ring (i.e., the distance between the first boundary line 132 and the second boundary line 134) is 200-800 μm, e.g., 220-750 μm, 300-700 μm, e.g., 300-500 μm, e.g., 350-450 μm. For example, the second boundary line 134 may approximately coincide with the boundary between the first display area 110 and the second display area 120. In this way, it can play a good light shielding effect without affecting and interfering with image acquisition and other wiring layout.

FIG. 7 schematically shows a schematic diagram of a pixel driving circuit according to some embodiments of the present disclosure. FIG. 8 schematically shows a wiring diagram of a pixel driving circuit according to some embodiments of the present disclosure (the first light shielding pattern is not shown). Referring to FIGS. 7-8, the pixel driving circuit 700 comprises transistors T1, T2, T3, T4, T5, T6, T7 and a capacitor Cst. The capacitor Cst comprises a first electrode plate Cst1 and a second electrode plate Cst2, and the second electrode plate Cst2 is connected to the first voltage wiring (e.g., VDD wiring). The first electrode of transistor T1 is connected with the first initialization voltage Vinit1, and the gate receives the reset signal Reset. The second electrode of the transistor T1, the first electrode plate Cst1, the gate of the transistor T3 and the first electrode of the transistor T2 are connected to the N1 node. The first electrode of the transistor T5 is connected to the first voltage wiring (e.g., VDD wiring). The first electrode of the transistor T4 is connected to the Data wiring. The second electrode of the transistor T5, the second electrode of the transistor T4 and the first electrode of the transistor T3 are connected to the N3 node. The second electrode of the transistor T2, the second electrode of the transistor T3 and the first electrode of the transistor T6 are connected to the N2 node. The first electrode of the transistor T7 is connected to the second initialization voltage Vinit2. The second electrode of the transistor T6, the second electrode of the transistor T7 and the anode of the single OLED device are connected to the N4 node. The gates of the transistor T2, the transistor T4 and the transistor T7 receive scan signals Gate from the gate lines. The gates of the transistor T5 and the transistor T6 receive emission control signals EM. The cathode of the single OLED device is connected to a second voltage wiring (e.g., VSS wiring). The working principle of the driving circuit shown in FIG. 7 is known to those skilled in the art and will not be repeated here. It should be understood that the pixel driving circuit of the present disclosure is not limited to the 7T1C circuit shown in FIG. 7, but may also adopt 2T1C, 4T2C, 6T2C or other forms of 7T1C circuits.

As shown in FIG. 8, when the first light shielding pattern is not shown, there are gaps between the wirings of each layer, resulting in diffraction and other effects on the light, interfering with the propagation of the light and affecting the image acquisition quality. Referring to FIGS. 4, 6, 7 and 8, in some embodiments, the first driving layer 320 comprises: a capacitor Cst comprising a first electrode plate Cst1 and a second electrode plate Cst2, the second electrode plate Cst2 being electrically connected to the first voltage wiring (e.g., VDD signal line) directly; an initialization transistor T1 providing an initialization voltage Vinit1 in response to a reset signal Reset; and a switching part 810, one end 812 of the switching part 810 being connected to the first electrode plate Cst1 and the other end 814 of the switching part 810 is connected to a second electrode of the initialization transistor T1, and wherein an orthographic projection of the first light shielding pattern 160 on the first display area 110 at least partly overlaps with an orthographic projection of the switching part 810 on the first display area 110. In some embodiments, the orthographic projection of the first light shielding pattern 160 on the first display area 110 completely covers the orthographic projection of the switching part 810 on the first display area 110. In some embodiments, the first light shielding pattern 160 is connected to the wiring 820 comprised in the first conductive layer 350 through a via hole and to the first voltage wiring (e.g., VDD wiring) through the wiring 820.

In this way, the first light shielding pattern 160 is insulated from the first pattern 372, the first light shielding pattern 160 blocks the switching part, and the first light shielding pattern 160 is electrically connected to the first voltage wiring (e.g., VDD signal line). The first light shielding pattern 160 plays the role of light shielding and blocks the switching part. Because the electrical signal of the first voltage wiring is relatively stable, it can avoid the poor display panel caused by floating connection, and improve the electromagnetic shielding effect and electrical reliability.

In some embodiments, as shown in FIG. 4, the first driving layer 320 further comprises a thin film transistor 380, which may correspond to transistor T3 in FIG. 7. The thin film transistor 380 comprises: an active layer 387, such as p-Si; a gate 388 (which can be multiplexed as the first electrode plate Cst1 of the capacitor Cst) and an electrode 389 (which can act as the second electrode plate Cst2 of the capacitor Cst). The first conductive layer 350 may further comprise a wiring 347 electrically connected to the gate 388 through a via hole (the wiring 347 is not electrically connected to the electrode 389). For example, the first conductive layer 350 may comprise a metal material, such as Mo, W, Cu, etc. In some embodiments, as shown in FIG. 4, the first substrate 330 may comprise a glass substrate 332 and a PI substrate 334. In some embodiments, the glass substrate 332 may be removed during the preparation of the display panel. The first driving layer 320 further comprises a buffer layer 336, a first gate insulating layer (GI1) 338, a second gate insulating layer (GI2) 339, an interlayer dielectric layer (ILD) 394, a passivation layer (PVX) 392, etc. The thin film transistor 340 may correspond to the transistor T6 in FIG. 7. The thin film transistor 340 may comprise a gate 348 and an active layer 346 (e.g., p-Si). The plurality of first light emitting units 310 may comprise a plurality of first anodes 312 (e.g., anodes of OLED devices), a pixel definition layer (PDL) 314 defining a space for accommodating light emitting material, light emitting material 318, and a first cathode layer 316 used in conjunction with the first anodes 312. Through such a setting, a display panel with high efficiency, reliability and good cooperation with the image acquisition device can be formed.

For example, referring to FIGS. 4 and 8, the first electrode plate Cst1 is integrated with the gate of the thin film transistor 380. For example, the main body portion 816 of the switching part 810 (i.e., the main wiring portion excluding one end 812 and the other end 814) is in the first conductive layer 350.

Referring to FIGS. 6 and 8, in some embodiments, the first light shielding pattern 160 is connected to the first voltage wiring, such as a VDD signal line, through a via hole. In some embodiments, the second pattern 510 is connected to the first voltage wiring, such as a VDD signal line, through a via hole 520. The first light shielding pattern 160 is electrically connected to the first voltage line, such as a VDD signal line, thereby improving the effect of electromagnetic shielding.

In some embodiments, as shown in FIG. 5, the second substrate 430 may comprise a glass substrate 432 and a PI substrate 434. In some embodiments, the glass substrate 432 may be removed during the preparation of the display panel. The second driving layer 420 may further comprise: a buffer layer 436, a first gate insulating layer (GI1) 438, a second gate insulating layer (GI2) 439, an interlayer dielectric layer (ILD) 494, a passivation layer (PVX) 492, etc. The plurality of second light emitting units 410 may comprise a plurality of second anodes 412 (e.g., anodes of OLED devices), a pixel definition layer (PDL) 414 defining a space for accommodating light emitting material, light emitting material 418, and a second cathode layer 416 used in conjunction with the second anode 412s. It should be understood that the glass substrate 432 and PI substrate 434 comprised in the second substrate 430, the buffer layer 436, the first gate insulating layer (GI1) 438, the second gate insulating layer (GI2) 439, the interlayer dielectric layer (ILD) 494, the passivation layer (PVX) 492 comprised in the second driving layer 420, and the second anodes 412, the pixel definition layer (PDL) 414, the light emitting material 418 and the second cathode layer 416 comprised in the plurality of second light emitting units 410 may be arranged in the same layer as the glass substrate 332 and the PI substrate 344 comprised in the first substrate 330, the buffer layer 336, the first gate insulating layer (GI1) 338, the second gate insulating layer (GI2) 339, the interlayer dielectric layer (ILD) 394, the passivation layer (PVX) 392 comprised in the second driving layer 320, and the second anode 312s, the pixel definition layer (PDL) 314, the light-emitting material 318 and the first cathode layer 316 comprised in the plurality of first light emitting units 310 respectively. Through such a setting, a display panel with high efficiency, reliability and good cooperation with the image acquisition device can be formed.

Referring back to FIGS. 1 and 3a, in some embodiments, the display panel 100 further comprises a second light shielding pattern 170 arranged on a side of the second display area 120 close to the frame area 140, and the second light shielding pattern 170 at least partially surrounds the second display area 120 and exposes at least part of the second display area 120. For example, as shown in FIGS. 1 and 3a, the second light shielding pattern 170 comprises an area surrounded by the third boundary line 138 and the upper boundary line 136 of the display area. In some embodiments, the second light shielding pattern 170 comprises a portion in the frame area 140 and a portion in the gap between the frame area 140 and the display area 105. By setting the second light shielding pattern, it can be used together with the first light shielding pattern, which increases the light shielding area and improves the light shielding effect.

FIG. 9 schematically shows a cross-sectional view of a frame area according to some embodiments of the present disclosure. In some embodiments, as shown in FIG. 9, the frame area 140 comprises: a third substrate 930 (which can be arranged in the same layer as the second substrate 430), planarization layers PLN1, PLN2, PLN3, PLN4 and PLN5 on the third substrate, wherein the second light shielding pattern 170 is on the planarization layer. In this way, the second light shielding pattern 170 can effectively use the original wiring layer in the frame area to realize the multiplexing of the wiring layer of the same layer without arranging an additional light shielding layer. In this way, the number of patterning processes is reduced, the preparation efficiency and yield are effectively improved, and the cost is reduced.

In some embodiments, as shown in FIGS. 1 to 3a and 9, the projection of the second light shielding pattern 170 in the second display area 120 does not overlap with the second display area 120. The second light shielding pattern 170 comprises an opening area 165, and the distance from the opening area 165 to the second display area 120 is greater than 10 μm.

For example, array distributed openings 166 are arranged in the opening area 165 for discharging the gas generated in the material layer during the preparation process, preventing the material layer from warping and deformation, so as to improve the flatness. It should be understood that, as required, as shown in FIG. 3a, openings 166 may also be provided at other positions of the frame area 140. For example, the distance between the opening area 165 and the second display area 120 may be 10-80 μm, e.g., 20 μm, 40 μm, 60 μm, 80 μM etc. For example, the second light shielding pattern 170 is not provided with an opening 166 in a portion located in the gap between the frame area 140 and the display area 105.

In some embodiments, the orthographic projection of the second light shielding pattern 170 in the frame area 140 is approximately a part of the ring shape, the ring shape surrounds the second display area 120, and the difference between the inner and outer radii of the ring (i.e., the distance between the third boundary line 138 and the second boundary line 134) is 200-800 μm, e.g., 220-750 μm, 300-700 μm, e.g., 300-500 μm, e.g., 350-450 μm. For example, the second boundary line 134 may approximately coincide with the boundary between the first display area 110 and the second display area 120. In this way, it can play a good light shielding effect without affecting and interfering with image acquisition and other wiring layout.

In some embodiments, as shown in FIG. 1, the orthographic projections of the first light shielding pattern 160 and the second light shielding pattern 170 on the plane where the display panel is located can form an approximately complete ring shape, and the inner circle of the ring shape approximately coincides with the boundary line between the first display area 110 and the second display area 120. In this case, the difference between the inner and outer radii of the ring (i.e. the distance between the outer circle and the inner circle) is 200-800 μm, e.g., 220-750 μm, 300-700 μm, e.g., 300-500 μm, e.g., 350-450 μm. In this way, the shielding in all directions can be realized, a good shielding effect can be achieved, and the image acquisition quality can be improved.

In some embodiments, the first light shielding pattern 160 may further comprise a protrusion 162 at the top of the second display area 120, so that light shielding can be performed in a wider range. For example, a protrusion 162 is added in the blank position where there is no other wiring in the second conductive layer. The orthographic projection of the protrusion 162 in the second display area can overlap with the orthographic projection of the upper second light shielding pattern 170 in the second display area, so as to further block the light together with the upper second light shielding pattern 170.

In some embodiments, as shown in FIGS. 5 and 9, the plurality of second light emitting units 410 comprise a plurality of second anodes 412, and the second light shielding pattern 170 is arranged in the same layer as the plurality of second anodes 412. In this way, the second light shielding pattern 170 can effectively use the original wiring layer in the frame area to realize the multiplexing of the wiring layer of the same layer without arranging an additional light shielding layer. In this way, the number of patterning processes is reduced, the preparation efficiency and yield are effectively improved, and the cost is reduced.

In some embodiments, the second light shielding pattern may include an ITO/Ag/ITO material or the like. In this way, on the one hand, the second anodes 412 can achieve a good luminous effect, and the second light shielding pattern 170 has a good shielding effect.

In some embodiments, the plurality of second light emitting units 410 further comprise a second cathode layer 416 corresponding to the plurality of second anodes 412, the second light shielding pattern 170 and the plurality of second anodes 412 are insulated from each other, and the second light shielding pattern 170 is electrically connected to the second cathode layer 416. In some embodiments, the second cathode layer 416 is connected to the second voltage wiring (e.g., VSS signal line), and the second light shielding pattern 170 is also electrically connected to the second voltage wiring (e.g., VSS signal line). For example, as shown in FIG. 9, the second light shielding pattern 170 may be insulated or separated from the plurality of first anodes 412 by a pixel definition layer (PDL) 414. The second light shielding pattern 170 is connected to the second voltage wiring (e.g., VSS signal line). Because the electrical signal of the second voltage wiring is relatively stable, the poor display panel caused by floating connection is avoided, and the electromagnetic shielding effect and electrical reliability are improved.

In some embodiments, as shown in FIG. 9, at the connection part 976, the second light shielding pattern 170 is stacked with the second cathode layer 416 to achieve good electrical contact. At the lapping part 978, the second light shielding pattern 170 is lapped with the second voltage wiring (e.g., VSS signal line) 974 to achieve good electrical contact.

In some embodiments, as shown in FIG. 9, the planarization layer of the frame area 140 may comprise a first planarization layer PLN1, a second planarization layer PLN2, a third planarization layer PLN3, a fourth planarization layer PLN4, a fifth planarization layer PLN5, etc., similar to those in the first display area. The frame area 140 may further comprise an interlayer dielectric layer (ILD) 994, a first voltage wiring (e.g., VDD signal line) 970, a dummy pixel 972, a panel crack detect (PCD) 980, a crack dam 990 to prevent crack propagation at the edge, a pixel definition layer (PDL) 414 on the second light shielding pattern 170, a spacer (PS) 920 for improving the film-forming quality of the second cathode layer 416, a first packaging layer (e.g., formed by CVD deposition of silicon oxide) 912 on the second cathode layer 416, a second packaging layer (e.g., made by inkjet printing process) on the first packaging layer, a third packaging layer (e.g., formed by CVD deposition of silicon nitride) on the second packaging layer, and a first dam 922 and a second dam 924 that prevent overflow of the second packaging layer during preparation. The first dam 922 and the second dam 924 can be made in the same layer as the spacer 920. Through these settings, a display panel with high efficiency, reliability and good cooperation with the image acquisition device can be formed.

In the display panel provided by the embodiment of the present disclosure, by setting the first light shielding pattern to at least partially surround the second display area and expose at least part of the second display area, it can reduce and block the influence of light diffraction generated by wiring in the first display area on image acquisition, block unwanted light and improve image acquisition quality. In this way, high image acquisition quality can be obtained even when the size of the second display area is limited. At the same time, since the first light shielding pattern is arranged in the first driving layer, the wiring layer in the first driving layer can be effectively used to realize the multiplexing of the wiring layer of the same layer without arranging an additional light shielding layer. In this way, the number of patterning processes is reduced, the preparation efficiency and yield are effectively improved, and the cost is reduced.

FIG. 10 schematically shows a schematic diagram of a display device according to some embodiments of the present disclosure. In some embodiments, as shown in FIG. 10, a display device 1000 comprises the aforementioned display panel 100; and the image acquisition device 180, which is located on an opposite side of the light exit side of the display panel 100, wherein at least part of the light transmitting regions of the second display area 120 is in the field of view 1010 of the image acquisition device 180. For example, the center of the second display area 120 coincides with the center of the field of view 1010 of the image acquisition device 180. The display device has similar advantages to the above display panel and will not be repeated here.

In some embodiments, referring to FIGS. 1, 2*a* and 10, the orthographic projection of the first light shielding pattern 160 on the first display area 110 is a part of the ring shape, and the size of the ring shape in the radial direction (i.e., the difference between the inner and outer diameters of the ring) is one fifteenth to four fifteenth of the diameter r of the image acquisition device 180 in the field of view area of the display panel 100. For example, in the case of r=3.0 mm, the size of the ring shape in the radial direction is 200-800 μm.

The present disclosure further provides a method for manufacturing a display panel, comprising: forming a first display area and a second display area, the first display area comprising a plurality of first light emitting units and a first driving layer for driving the plurality of first light emitting units; the second display area being at least partially surrounded by the first display area, and making the ambient light at least partially transmitted, wherein the first driving layer comprises a first light shielding pattern, the first light shielding pattern at least partially surrounding the second display area and comprising a hollow structure which exposes at least part of the second display area. The method for manufacturing the display panel has similar advantages to the above display panel, and will not be repeated here.

It should be understood that in the description of the present disclosure, each transistor may, for example, take the form of a thin film transistor, which is typically fabricated so that their first and second electrodes can be used interchangeably. Other embodiments are also contemplated.

As will be apparent to those skilled in the art, many different ways of performing the methods of these embodiments of the present disclosure are possible. For example, the order of steps can be changed, or some steps can be performed in parallel. In addition, other method steps can be inserted between steps. The inserted step may represent an improvement of a method such as that described herein, or may be independent of the method. In addition, a given step may not be fully completed before the next step begins. It should be understood that the features of different embodiments in the present disclosure can be combined with each other without contradiction.

Those skilled in the art can make various amendments and modifications to the present disclosure without departing from the spirit and scope of the present disclosure. Thus, if these amendments and modifications of the present disclosure fall within the scope of the claims of the present disclosure and their equivalents, the present disclosure is also intended to include these amendments and modifications.

The invention claimed is:

1. A display panel, comprising:
   a first display area, comprising a plurality of first light emitting units and a first driving layer for driving the plurality of first light emitting units; and
   a second display area, at least partially surrounded by the first display area, and configured to make ambient light at least partially transmitted,
   wherein the first driving layer comprises a first light shielding pattern, the first light shielding pattern at least partially surrounding the second display area and comprising a hollow structure which exposes at least part of the second display area
   wherein the second display area comprises a plurality of second light emitting units and a second driving layer for driving the plurality of second light emitting units,
   wherein the display panel further comprises a frame area located on a periphery of the display panel, the frame area comprising a driving device for driving the plurality of second light emitting units, and
   wherein the second driving layer comprises a transparent wiring area, the plurality of second light emitting units are electrically connected to the driving device through the transparent wiring area,
   the display panel further comprising:
   a second light shielding pattern arranged on a side of the second display area close to the frame area, the second light shielding pattern at least partially surrounding the second display area and exposing at least part of the second display area,
   wherein an orthographic projection of the second light shielding pattern on the second display area does not overlap with the second display area, the second light shielding pattern comprises an opening area, a distance between the opening area and the second display area is greater than 10 μm.

2. The display panel according to claim 1, wherein a density of light emitting regions of the plurality of first light emitting units is arranged to be not less than a density of light emitting regions of the plurality of second light emitting units.

3. The display panel according to claim 1, wherein the first display area comprises:
   a first substrate, on which the first driving layer is located, the plurality of first light emitting units being located on a side of the first driving layer away from the first substrate, and the plurality of first light emitting units comprising a plurality of first anodes,
   wherein the first driving layer comprises:
   a driving circuit unit on the first substrate, the driving circuit unit comprising a thin film transistor;
   a first conductive layer comprising a first electrode and a second electrode, the first electrode and the second electrode acting as source and drain of the thin film transistor;
   a first planarization layer on the first conductive layer; and
   a second conductive layer on the first planarization layer, the second conductive layer comprising a plurality of first patterns and the first light shielding pattern, one of the plurality of first patterns being connected to the first electrode of the corresponding thin film transistor through a via hole in the first planarization layer, and one of the first patterns being electrically connected with a corresponding one of the plurality of first anodes.

4. The display panel according to claim 3, wherein the first light shielding pattern is connected to a first voltage wiring through a via hole.

5. The display panel according to claim 1,
   wherein the plurality of second light emitting units comprise a plurality of second anodes,
   wherein the second display area comprises a second substrate on which the second driving layer is located, the plurality of second light emitting units being located on a side of the second driving layer away from the second substrate, and
   wherein each of the plurality of second anodes is electrically connected to a corresponding driving device through a transparent wiring in the transparent wiring area.

6. The display panel according to claim 3, wherein the first display area further comprises:
   at least one planarization layer on the second conductive layer, wherein one of the plurality of first anodes is electrically connected with the first electrode of the thin film transistor via the via hole passing through the at least one planarization layer.

7. The display panel according to claim 1, wherein an orthographic projection of the first light shielding pattern on the first display area is a part of a ring shape, the ring shape surrounds the second display area and a difference between inner and outer radii of the ring shape is 200-800 μm.

8. The display panel according to claim 3, wherein at least one of the first patterns is electrically insulated from the first light shielding pattern, and an orthographic projection of the at least one of the first patterns on the first display area does not overlap with an orthographic projection of the first light shielding pattern on the first display area.

9. The display panel according to claim 4, wherein, the first driving layer comprises:
  a capacitor comprising a first electrode plate and a second electrode plate, the second electrode plate being electrically connected to the first voltage wiring directly;
  an initialization transistor providing an initialization voltage in response to a reset signal; and
  a switching part, one end of the switching part being connected to the first electrode plate and another end is connected to a second electrode of the initialization transistor,
  wherein an orthographic projection of the first light shielding pattern on the first display area at least partly overlaps with an orthographic projection of the switching part on the first display area.

10. The display panel according to claim 1, wherein the plurality of second light emitting units comprises a plurality of second anodes, the second light shielding pattern and the plurality of second anodes are arranged in a same layer.

11. The display panel according to claim 10, wherein the plurality of second light emitting units further comprise a second cathode layer corresponding to the plurality of second anodes, the second light shielding pattern and the plurality of second anodes are insulated from each other, and the second light shielding pattern is electrically connected to the second cathode layer.

12. A display device, comprising:
  a display panel according to claim 1; and
  an image acquisition device located on an opposite side of a light exit side of the display panel,
  wherein at least part of light transmitting regions of the second display area is in a field of view of the image acquisition device.

13. The display device according to claim 12, wherein an orthographic projection of the first light shielding pattern on the first display area is a part of a ring shape, and a size of the ring shape in a radial direction is one fifteenth to four fifteenth of a diameter of the image acquisition device in a field of view area of the display panel.

14. A method for manufacturing a display panel, comprising:
  forming a first display area and a second display area, the first display area comprising a plurality of first light emitting units and a first driving layer for driving the plurality of first light emitting units, the second display area being at least partially surrounded by the first display area, and configured to make ambient light at least partially transmitted,
  wherein the first driving layer comprises a first light shielding pattern, the first light shielding pattern at least partially surrounding the second display area and comprising a hollow structure which exposes at least part of the second display area,
  wherein the second display area comprises a plurality of second light emitting units and a second driving layer for driving the plurality of second light emitting units,
  wherein the display panel further comprises a frame area located on a periphery of the display panel, the frame area comprising a driving device for driving the plurality of second light emitting units, and
  wherein the second driving layer comprises a transparent wiring area, the plurality of second light emitting units are electrically connected to the driving device through the transparent wiring area,
  wherein the display panel further comprises a second light shielding pattern arranged on a side of the second display area close to the frame area, the second light shielding pattern at least partially surrounding the second display area and exposing at least part of the second display area,
  wherein an orthographic projection of the second light shielding pattern on the second display area does not overlap with the second display area, the second light shielding pattern comprises an opening area, a distance between the opening area and the second display area is greater than 10 μm.

15. The display panel according to claim 1, wherein the first display area comprises:
  a first substrate, on which the first driving layer is located, the plurality of first light emitting units being located on a side of the first driving layer away from the first substrate, and the plurality of first light emitting units comprising a plurality of first anodes,
  wherein the first driving layer comprises:
    a driving circuit unit on the first substrate, the driving circuit unit comprising a thin film transistor;
    a first conductive layer comprising a first electrode and a second electrode, the first electrode and the second electrode acting as source and drain of the thin film transistor;
    a first planarization layer on the first conductive layer; and
    a second conductive layer on the first planarization layer, the second conductive layer comprising a plurality of first patterns and the first light shielding pattern, one of the plurality of first patterns being connected to the first electrode of the corresponding thin film transistor through a via hole in the first planarization layer, and one of the first patterns being electrically connected with a corresponding one of the plurality of first anodes.

16. The display panel according to claim 2, wherein the first display area comprises:
  a first substrate, on which the first driving layer is located, the plurality of first light emitting units being located on a side of the first driving layer away from the first substrate, and the plurality of first light emitting units comprising a plurality of first anodes,
  wherein the first driving layer comprises:
    a driving circuit unit on the first substrate, the driving circuit unit comprising a thin film transistor;
    a first conductive layer comprising a first electrode and a second electrode, the first electrode and the second electrode acting as source and drain of the thin film transistor;
    a first planarization layer on the first conductive layer; and
    a second conductive layer on the first planarization layer, the second conductive layer comprising a plurality of first patterns and the first light shielding pattern, one of the plurality of first patterns being connected to the first electrode of the corresponding thin film transistor through a via hole in the first planarization layer, and one of the first patterns being electrically connected with a corresponding one of the plurality of first anodes.

17. The display device according to claim 12, wherein the second display area comprises a plurality of second light emitting units and a second driving layer for driving the plurality of second light emitting units, wherein the display panel further comprises a frame area located on a periphery of the display panel, the frame area comprising a driving device for driving the plurality of second light emitting units, and wherein the second driving layer comprises a transparent wiring area, the plurality of second light emitting units are electrically connected to the driving device through the transparent wiring area.

\* \* \* \* \*